(12) United States Patent
Satou

(10) Patent No.: US 9,125,309 B2
(45) Date of Patent: Sep. 1, 2015

(54) EPOXY RESIN, CURABLE RESIN COMPOSITION AND CURED PRODUCT THEREOF, AND PRINTED WIRING BOARD

(75) Inventor: Yutaka Satou, Ichihara (JP)

(73) Assignee: DIC Corporation, Tokyo (JP)

( * ) Notice: Subject to any disclaimer, the term of this patent is extended or adjusted under 35 U.S.C. 154(b) by 0 days.

(21) Appl. No.: 14/343,924

(22) PCT Filed: Jul. 11, 2012

(86) PCT No.: PCT/JP2012/067699
§ 371 (c)(1),
(2), (4) Date: Mar. 10, 2014

(87) PCT Pub. No.: WO2013/042438
PCT Pub. Date: Mar. 28, 2013

(65) Prior Publication Data
US 2014/0287241 A1    Sep. 25, 2014

(30) Foreign Application Priority Data

Sep. 21, 2011   (JP) .................................. 2011-205956

(51) Int. Cl.
| | |
|---|---|
| *B32B 27/38* | (2006.01) |
| *C08G 59/50* | (2006.01) |
| *C08L 61/02* | (2006.01) |
| *H05K 1/03* | (2006.01) |
| *C08G 59/32* | (2006.01) |
| *C08G 59/02* | (2006.01) |
| *H05K 3/00* | (2006.01) |

(52) U.S. Cl.
CPC .............. *H05K 1/036* (2013.01); *C08G 59/02* (2013.01); *C08G 59/3218* (2013.01); *H05K 1/0326* (2013.01); *H05K 3/0058* (2013.01)

(58) Field of Classification Search
None
See application file for complete search history.

(56) References Cited

U.S. PATENT DOCUMENTS

| | | | |
|---|---|---|---|
| 4,551,508 A | 11/1985 | Urasaki | |
| 2003/0049913 A1* | 3/2003 | Gaku et al. .................. | 438/411 |
| 2013/0144030 A1* | 6/2013 | Satou ........................... | 528/403 |

FOREIGN PATENT DOCUMENTS

| | | |
|---|---|---|
| JP | 62-20206 B2 | 12/1984 |
| JP | 05-287052 A | 11/1993 |
| JP | 08-074090 A | 3/1996 |
| JP | 2000-038430 A | 2/2000 |
| WO | WO2012023435 * | 2/2012 |

OTHER PUBLICATIONS

Oshimi et al., JP 2000-038430 machine translation. Feb. 8, 2000.*
Sakata et al., Machine translation of JP05287052, Nov. 2, 1993.*
International Search Report dated Oct. 16, 2012, issued for PCT/JP2012/067699.

* cited by examiner

*Primary Examiner* — Coris Fung
(74) *Attorney, Agent, or Firm* — Locke Lord LLP; James E. Armstrong, IV

(57) ABSTRACT

Provided is an epoxy resin allowing a cured product that is less changed in terms of heat resistance due to thermal history and has low thermal expansion, the epoxy resin having high solvent solubility. The epoxy resin is a polyglycidyl ether of a naphthol-novolac resin including, at predetermined proportions, a trimer and a dimer that have specific structures.

16 Claims, 7 Drawing Sheets

EPOXY RESIN, CURABLE RESIN COMPOSITION AND CURED PRODUCT THEREOF, AND PRINTED WIRING BOARD

TECHNICAL FIELD

The present invention relates to an epoxy resin providing a cured product that is less changed in terms of heat resistance due to thermal history and has very low thermal expansion, the epoxy resin being suitably usable for a printed wiring board, a semiconductor sealing material, a coating material, a casting application, or the like; a cured product of a curable resin composition satisfying these properties; and a printed wiring board.

BACKGROUND ART

Epoxy resins are used for adhesives, molding materials, coating materials, photoresist materials, developer materials, and the like. In addition, epoxy resins can provide cured products that are excellent in terms of heat resistance, moisture resistance, and the like and hence are widely used for, for example, semiconductor sealing materials and insulating materials for printed wiring boards in electric and electronic fields.

Among these various applications, in the field of printed wiring boards, with the trend toward electronic devices having a smaller size and higher performance, there is a strong tendency of narrowing the wiring pitch of semiconductor devices to achieve a higher density. In response to this tendency, a semiconductor mounting method that is a flip chip bonding method in which a semiconductor device is bonded to a substrate with solder balls is widely used. This flip chip bonding method is a so-called reflowing semiconductor mounting method in which solder balls are placed between a wiring board and a semiconductor and the entire structure is heated to achieve fusion bonding. Accordingly, the wiring board itself is exposed to a high-temperature environment during solder reflowing; the wiring board is thermally contracted to cause a large stress in the solder balls that bond together the wiring board and the semiconductor, resulting in poor connection of the wiring in some cases. For this reason, there is a demand for an insulating material having a low thermal expansion coefficient for printed wiring boards.

In addition, in recent years, due to laws, regulations, and the like relating to the environmental issues, lead-free high-melting-point solders have been mainly used and the reflowing temperature has become high. As a result, poor connection due to warpage of printed wiring boards caused by change in the heat resistance of insulating materials during reflowing has become severe. Accordingly, there is a demand for materials that are less changed in terms of physical properties during reflowing.

In order to satisfy such a demand, for example, a thermosetting resin composition containing, as a main component, a naphthol-novolac epoxy resin obtained by the reaction between naphthol, formaldehyde, and epichlorohydrin has been proposed as a composition that achieves the technical objects such as low thermal expansion (refer to Patent Literature 1 below).

Compared with general phenol-novolac epoxy resins, the above-described naphthol-novolac epoxy resins allow, due to their rigid skeletons, an improvement in the thermal expansion coefficients of the resultant cured products. However, this improvement does not sufficiently satisfy the required level in recent years. In addition, the cured products are considerably changed in terms of heat resistance due to thermal history. Accordingly, in the printed-wiring-board applications, the heat resistance is considerably changed due to reflowing, which tends to result in the above-described poor connection in printed wiring boards.

There is another known naphthol-novolac epoxy resin, for example, an epoxy resin produced by polycondensation between α-naphthol, β-naphthol, and aldehyde (refer to Patent Literature 2 below). However, such an epoxy resin has a high content of a dimer of β-naphthol and hence the resin has high crystallinity and low solvent solubility and is not sufficiently cured during the curing reaction. Accordingly, the resultant cured products are also considerably changed in terms of heat resistance due to thermal history.

CITATION LIST

Patent Literature

PTL 1: Japanese Examined Patent Application Publication No. 62-20206

PTL 2: Japanese Unexamined Patent Application Publication No. 5-287052

SUMMARY OF INVENTION

Technical Problem

Accordingly, an object of the present invention is to provide a curable resin composition providing a cured product that is less changed in terms of heat resistance due to thermal history and has low thermal expansion, the curable resin composition having high solvent solubility; a cured product of the curable resin composition; a printed wiring board that is less changed in terms of heat resistance due to thermal history and has very low thermal expansion; and an epoxy resin that provides these properties.

Solution to Problem

The inventors of the present invention performed thorough studies on how to achieve the object. As a result, the inventors have found that an epoxy resin that is a polyglycidyl ether of a naphthol-novolac resin including, at predetermined proportions, a trimer and a dimer that have specific structures provides a cured product that has very low thermal expansion and is less changed in terms of heat resistance due to thermal history because of enhanced reactivity of the epoxy resin itself. Thus, the inventors have accomplished the present invention.

Specifically, the present invention relates to an epoxy resin that is a polyglycidyl ether of a polycondensate of an α-naphthol compound, a β-naphthol compound, and formaldehyde, the epoxy resin including:

a trimer (x1) represented by a structural formula (1) below

[Chem. 1]

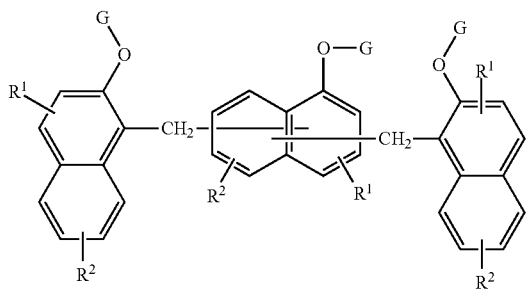
(1)

(in the formula, $R^1$ and $R^2$ each independently represent a hydrogen atom, an alkyl group having 1 to 4 carbon atoms, or an alkoxy group having 1 to 4 carbon atoms; and G represents a glycidyl group); and a dimer (x2) represented by a structural formula (2) below

[Chem. 2]

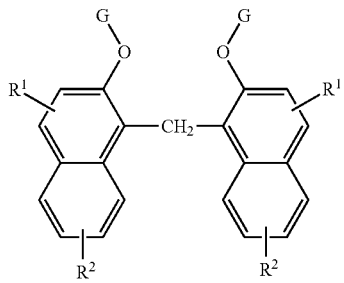
(2)

(in the formula, $R^1$ and $R^2$ each independently represent a hydrogen atom, an alkyl group having 1 to 4 carbon atoms, or an alkoxy group having 1 to 4 carbon atoms; and G represents a glycidyl group), wherein a content of the trimer (x1) is 15% to 35% in terms of area percentage in GPC measurement, and a content of the dimer (x2) is 1% to 25% in terms of area percentage in GPC measurement.

The present invention also relates to a curable resin composition including, as essential components, the above-described epoxy resin and a curing agent.

The present invention also relates to a cured product produced by curing the above-described curable resin composition.

The present invention also relates to a printed wiring board produced by mixing the above-described curable resin composition with an organic solvent to prepare a resin composition varnish, impregnating the varnish into a reinforcing base, and subjecting a laminate of the reinforcing base and a copper foil to thermocompression bonding.

Advantageous Effects of Invention

The present invention can provide a curable resin composition allowing a cured product that is less changed in terms of heat resistance due to thermal history and has low thermal expansion, the curable resin composition also having high solvent solubility; a cured product of the curable resin composition; a printed wiring board that is less changed in terms of heat resistance due to thermal history and has very low thermal expansion; and an epoxy resin that provides these properties.

DESCRIPTION OF EMBODIMENTS

Figure 1:
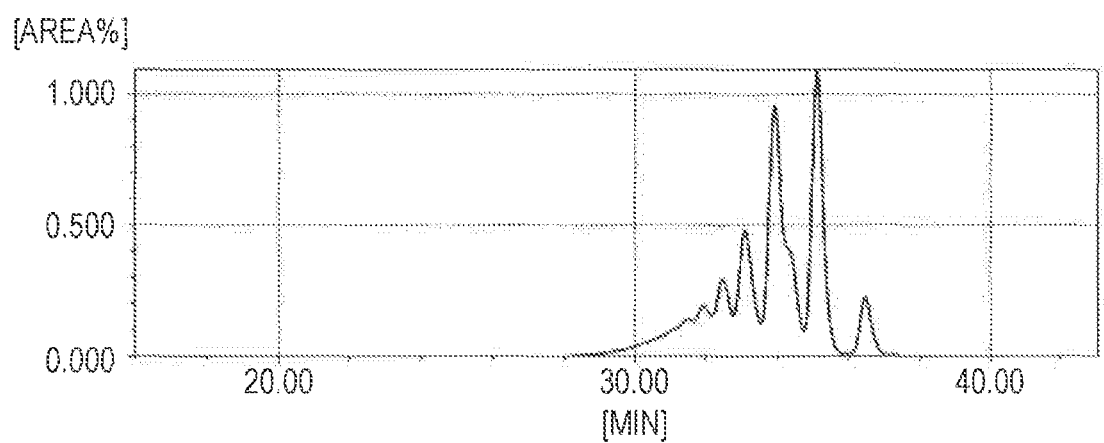
FIG. 1 is a GPC chart of an epoxy resin (A-1) obtained in Example 1.

Hereinafter, the present invention will be described in detail.

The present invention provides an epoxy resin that is a polyglycidyl ether of a polycondensate of an α-naphthol compound, a β-naphthol compound, and formaldehyde, the epoxy resin including:

a trimer (x1) represented by a structural formula (1) below

[Chem. 3]

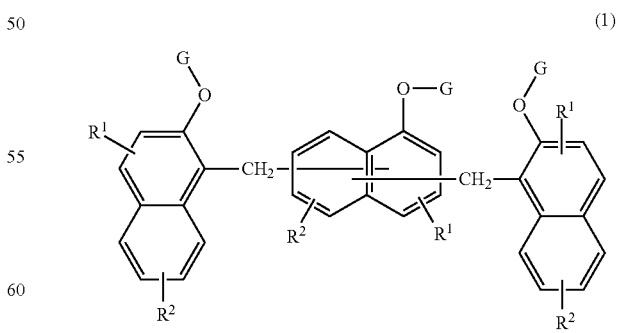
(1)

(in the formula, $R^1$ and $R^2$ each independently represent a hydrogen atom, an alkyl group having 1 to 4 carbon atoms, or an alkoxy group having 1 to 4 carbon atoms; and G represents a glycidyl group); and a dimer (x2) represented by a structural formula (2) below

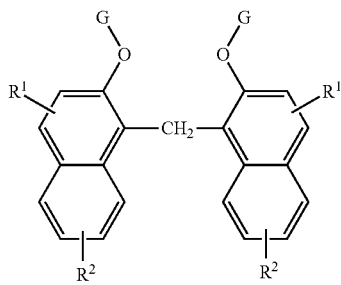

(in the formula, $R^1$ and $R^2$ each independently represent a hydrogen atom, an alkyl group having 1 to 4 carbon atoms, or an alkoxy group having 1 to 4 carbon atoms; and G represents a glycidyl group), wherein a content of the trimer (x1) is 15% to 35% by mass in terms of area percentage in GPC measurement, and a content of the dimer (x2) is 1% to 25% by mass in terms of area percentage in GPC measurement.

That is, an epoxy resin according to the present invention is a polyglycidyl ether of a polycondensate of an α-naphthol compound, a β-naphthol compound, and formaldehyde that serve as raw materials; the epoxy resin is a mixture including various resin structures and the mixture contains predetermined amounts of the trimer (x1) and the dimer (x2). In the present invention, the epoxy resin contains the trimer (x1) and hence has a high degree of orientation on the molecular level and provides a cured product having very low thermal expansion. In addition, since the trimer (x1) itself has high reactivity and hence the cured product is less changed in terms of heat resistance due to thermal history. Thus, in the printed-wiring-board applications, the epoxy resin serves as a material that is less changed in terms of physical properties due to reflowing.

Here, as described above, the content of the trimer (x1) is 15% to 35% in terms of area percentage in GPC measurement. When the content is more than 35% by mass, the solvent solubility of the epoxy resin becomes low. On the other hand, when the content is less than 15%, the cured product has a high linear expansion coefficient.

Specific examples of the trimer (x1) include compounds represented by the following structural formulae (1-1) to (1-6)

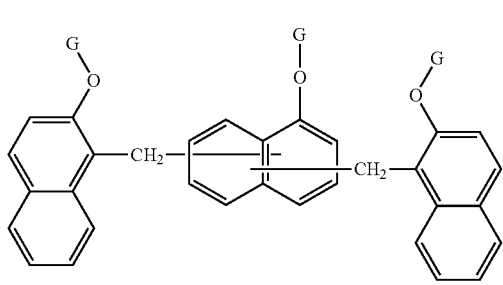

1-1

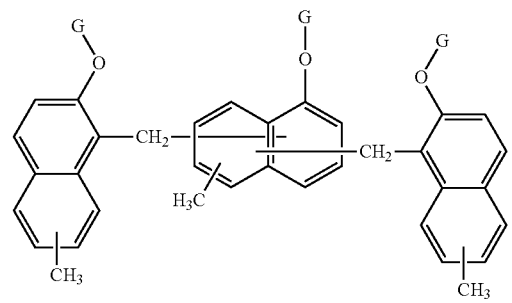

1-2

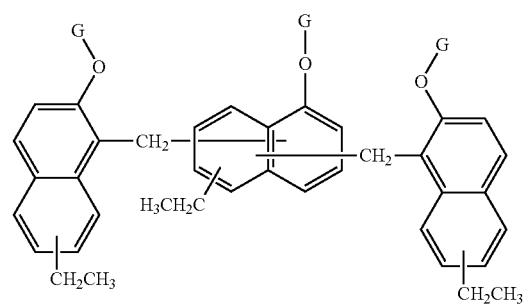

1-3

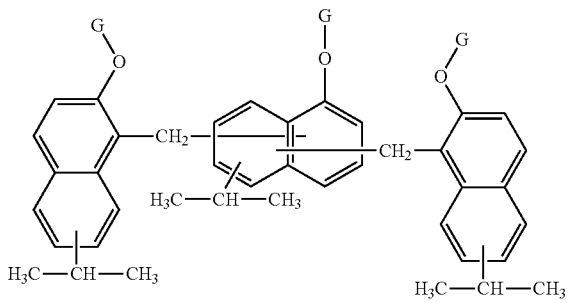

1-4

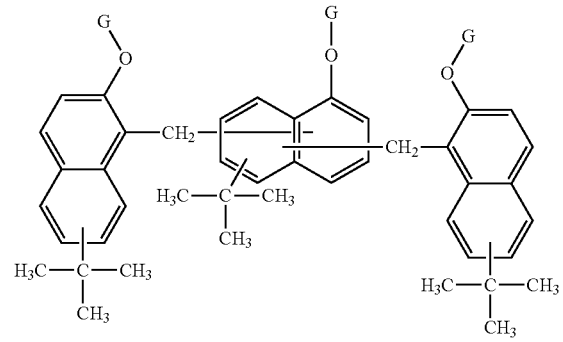

1-5

1-6

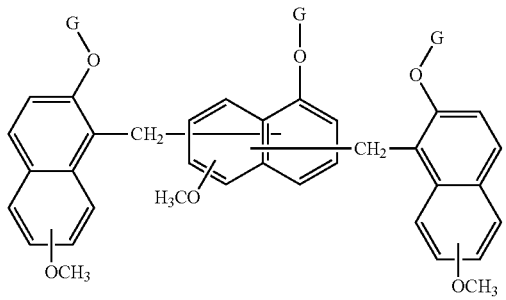

Among these, in particular, the compound represented by the structural formula 1-1, that is, a compound represented by the structural formula (1) in which $R^1$ and $R^2$ each represent a hydrogen atom is preferred because change in the heat resistance of the cured product due to thermal history is small.

In addition, in the present invention, the content of the dimer (x2) is 1% or more and hence the cured product has very low linear expansion. Since the content of the dimer (x2) is 25% or less, high solvent solubility can be exhibited and use as a varnish for a printed wiring board is allowed.

Furthermore, an epoxy resin according to the present invention preferably includes, in addition to the trimer (x1) and the dimer (x2), a calixarene compound (x3) represented by a structural formula (3) below

[Chem. 6]

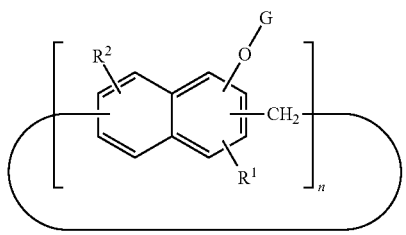

(3)

(in the formula, $R^1$ and $R^2$ each independently represent a hydrogen atom, an alkyl group having 1 to 4 carbon atoms, or an alkoxy group having 1 to 4 carbon atoms; G represents a glycidyl group; and n represents a number of the repeating unit and an integer of 2 to 10), wherein a content of the calixarene compound (x3) in the epoxy resin is 1% to 40% in terms of area percentage in GPC measurement, because the cured product exhibits lower linear expansion.

Here, $R^1$ and $R^2$ in the structural formula (3) are defined as in the structural formula (1). n represents the number of the repeating unit and an integer of 2 to 10. n is preferably 4 because the cured product of an epoxy resin according to the present invention exhibits lower linear expansion.

In the present invention, the contents of the trimer (x1), the dimer (x2), and the calixarene compound (x3) in the epoxy resin are calculated as peak area percentages of the structures with respect to the total peak area of the epoxy resin according to the present invention in GPC measurement under the following conditions.

<GPC Measurement Conditions>
Measurement apparatus: "HLC-8220 GPC" manufactured by Tosoh Corporation
Columns: guard column "HXL-L" manufactured by Tosoh Corporation
"TSK-GEL G2000HXL" manufactured by Tosoh Corporation
"TSK-GEL G2000HXL" manufactured by Tosoh Corporation
"TSK-GEL G3000HXL" manufactured by Tosoh Corporation
"TSK-GEL G4000HXL" manufactured by Tosoh Corporation
Detector: RI (differential refractometer)
Data processing: "GPC-8020 Model II version 4.10" manufactured by Tosoh Corporation
Measurement conditions:
Column temperature 40° C.
Developing solvent tetrahydrofuran
Flow rate 1.0 ml/min
Standards: The following monodisperse polystyrenes whose molecular weights are known were used in compliance with the measurement manual of the "GPC-8020 Model II version 4.10".
(Used Polystyrenes)
"A-500" manufactured by Tosoh Corporation
"A-1000" manufactured by Tosoh Corporation
"A-2500" manufactured by Tosoh Corporation
"A-5000" manufactured by Tosoh Corporation
"F-1" manufactured by Tosoh Corporation
"F-2" manufactured by Tosoh Corporation
"F-4" manufactured by Tosoh Corporation
"F-10" manufactured by Tosoh Corporation
"F-20" manufactured by Tosoh Corporation
"F-40" manufactured by Tosoh Corporation
"F-80" manufactured by Tosoh Corporation
"F-128" manufactured by Tosoh Corporation
Sample: 1.0% by mass tetrahydrofuran solution (50 μl) in terms of resin solid content prepared by filtration through a microfilter An epoxy resin according to the present invention may further include, in addition to the trimer (x1), the dimer (x2), and the calixarene compound (x3) described above, a high-molecular-weight component (x4).

The high-molecular-weight component (x4) is a high-molecular-weight component other than the (x1) to (x3) in an epoxy resin according to the present invention. Specifically, the high-molecular-weight component (x4) is an epoxy resin having a basic structure formed by bonding structural units (I) and (II) through a methylene linkage so as to have a high molecular weight, the structural unit (I) being represented by the following structural formula (I)

[Chem. 7]

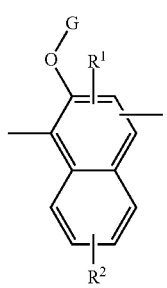

(I)

(in the formula, $R^1$ and $R^2$ each independently represent a hydrogen atom, an alkyl group having 1 to 4 carbon atoms, or an alkoxy group having 1 to 4 carbon atoms; and G represents a glycidyl group), and the structural unit (II) being represented by the following structural formula (II)

[Chem. 8]

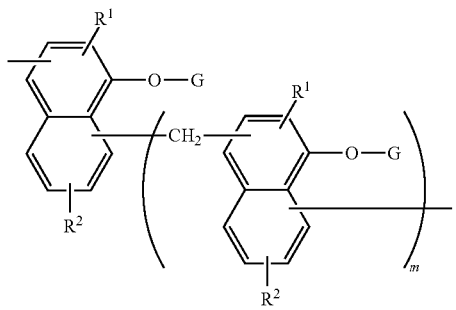

(II)

(in the formula, $R^1$ and $R^2$ each independently represent a hydrogen atom, an alkyl group having 1 to 4 carbon atoms, or an alkoxy group having 1 to 4 carbon atoms; G represents a glycidyl group; and m represents a number of the repeating unit and an integer of 0 or more).

In GPC measurement, the dimer (x2), the trimer (x1), and the calixarene compound (x3) are detected in this order that is the descending order of retention time. Compared with the calixarene compound (x3), the high-molecular-weight component (x4) is detected in a region of short retention time. The content of the high-molecular-weight component (x4) in the epoxy resin is preferably 40% to 75% by mass in terms of area percentage in GPC measurement because the epoxy resin has high solvent solubility. The specific structure of the high-molecular-weight component (x4) may be a resin structure (x4-1) in which the structural units (I) and (II) are alternately bonded through a methylene linkage, or a resin structure (x4-2) in which the structural units (II) are bonded to both ends of the structural unit (I) through methylene linkages. In the present invention, the high-molecular-weight component (x4) preferably has the resin structure (x4-2) in view of low thermal expansion. Note that, in the resin structure (x4-2), the structural units (II) are positioned at both ends of the structure as described above and, in the two dangling bonds of each structural unit (II), the dangling bond that is not bonded to the methylene linkage is bonded to a hydrogen atom.

In the case of using, as raw-material components of the polycondensate, an α-naphthol compound, a β-naphthol compound, formaldehyde, and another novolac resin in combination, the resultant high-molecular-weight component (x4) has a high molecular weight as a result of bonding between the structural units (I) and (II) and the other novolac resin through methylene linkages. When the other novolac resin is used as another raw-material component of the polycondensate for production, the amount of the other novolac resin used is preferably 5 to 30 parts by mass with respect to 100 parts by mass of the total mass of the α-naphthol compound and the β-naphthol compound serving as raw materials because the epoxy resin finally obtained has high reactivity.

The epoxy resin according to the present invention having been described so far in detail preferably has a softening point in a range of 95° C. to 140° C. because the epoxy resin itself has high solvent solubility. For this reason, the molecular weight of the high-molecular-weight component (x4) may be appropriately adjusted such that the softening point of the epoxy resin is within the above-described range. In particular, the softening point is preferably in a range of 100° C. to 135° C. because low thermal expansion and solvent solubility can be achieved at high levels.

In addition, an epoxy resin according to the present invention preferably has an epoxy equivalent weight in a range of 210 to 300 g/eq because the cured product has sufficiently low thermal expansion, in particular, preferably in a range of 220 to 260 g/eq.

The epoxy resin according to the present invention having been described so far in detail can be produced by, for example, the following first or second method.

First method: a method of obtaining a target epoxy resin by causing a reaction between a β-naphthol compound and formaldehyde in the presence of an organic solvent and an alkaline catalyst and subsequently adding an α-naphthol compound in the presence of formaldehyde to cause a reaction to provide a naphthol resin (step 1), and subsequently causing a reaction between this naphthol resin and epihalohydrin (step 2).

Second method: a method of obtaining a target epoxy resin by causing a reaction between an α-naphthol compound, a β-naphthol compound, and formaldehyde in the presence of an organic solvent and an alkaline catalyst to provide a naphthol resin (step 1), and subsequently causing a reaction between this naphthol resin and epihalohydrin (step 2).

In the present invention, in the step 1 of the first or second method, by using the alkaline catalyst as a reaction catalyst and by using the organic solvent in a small amount with respect to the raw-material components, the contents of the trimer (x1), the dimer (x2), and the calixarene compound (x3) in the epoxy resin can be adjusted to be in predetermined ranges and the content of the high-molecular-weight component is also in an appropriate range.

Examples of the alkaline catalyst used here include alkali metal hydroxides such as sodium hydroxide and potassium hydroxide; and inorganic alkalis such as sodium metal, lithium metal, sodium hydride, sodium carbonate, and potassium carbonate. The amount of the alkaline catalyst used is preferably, in terms of mole, 0.01 to 2.0 times the total moles of phenolic hydroxyl groups of raw-material components that are an α-naphthol compound and a β-naphthol compound, and optionally the other novolac resin.

Examples of the organic solvent include methyl cellosolve, isopropyl alcohol, ethyl cellosolve, toluene, xylene, and methyl isobutyl ketone. Of these, isopropyl alcohol is particularly preferred because the polycondensate has a relatively high molecular weight.

In the present invention, the amount of the organic solvent used is preferably, in the case of using raw-material components that are an α-naphthol compound and a β-naphthol compound and another novolac resin in combination, in the range of 5 to 70 parts by mass with respect to 100 parts by mass of the total mass of the α-naphthol compound and the β-naphthol compound serving as raw materials because the contents of the trimer (x1), the dimer (x2), and the calixarene compound (x3) in the epoxy resin are easily adjusted to be in predetermined ranges.

Specific examples of the α-naphthol compound serving as a raw-material component include α-naphthol and compounds in which the nucleus of α-naphthol is substituted with an alkyl group such as a methyl group, an ethyl group, a propyl group, or a t-butyl group, or an alkoxy group such as a methoxy group or an ethoxy group. Examples of the β-naphthol compound include β-naphthol and compounds in which the nucleus of β-naphthol is substituted with an alkyl group such as a methyl group, an ethyl group, a propyl group, or a t-butyl group, or an alkoxy group such as a methoxy group or an ethoxy group. Of these, α-naphthol and β-naphthol that have no substituents are preferred because the cured product of the finally obtained epoxy resin is less changed in terms of heat resistance due to thermal history.

On the other hand, the formaldehyde used here may be a formalin solution in the aqueous solution state or paraformaldehyde in the solid state.

The ratio of the α-naphthol compound to the β-naphthol compound used in the step 1 of the first or second method preferably satisfies a molar ratio (α-naphthol compound/β-naphthol compound)=[1/0.4] to [1/1.2] because the contents of components in the finally obtained epoxy resin are easily adjusted.

The ratio of formaldehyde charged in the reaction to the total number of moles of the α-naphthol compound and the β-naphthol compound is preferably, in terms of mole, 0.6 to 2.0, in particular, 0.6 to 1.5 because very low thermal expansion is achieved.

In the present invention, as described above, in addition to the α-naphthol compound, the β-naphthol compound, and formaldehyde, another novolac resin may be used as another raw-material component. Here, examples of the other novolac resin used include a phenol-novolac resin and a cresol-novolac resin. By using such a resin as another component, the finally obtained epoxy resin can have very high solvent solubility. The phenol-novolac resin and the cresol-novolac resin preferably have a softening point of 60° C. to 120° C. because the solvent solubility can be enhanced without degrading properties such as low linear expansion in the present invention.

In the case of using the other novolac resin as another raw-material component, the raw-material components charged in the reaction in the step 1 of the first or second method preferably satisfy a molar ratio (α-naphthol compound and β-naphthol compound/number of aromatic nuclei of the other novolac resin)=[1/0.06] to [1/0.36] because the contents of components in the finally obtained epoxy resin are easily adjusted. In addition, the amount of formaldehyde used is preferably, in terms of mole, 0.6 to 2.0 times the total number of moles of the number of aromatic nuclei of the other novolac resin, the α-naphthol compound, and the β-naphthol compound. In particular, the amount is preferably 0.6 to 1.5 times because heat resistance and solvent solubility are highly balanced.

In the step 1 of the first method, predetermined amounts of the β-naphthol compound, formaldehyde, an organic solvent, and an alkaline catalyst are charged into a reaction vessel; a reaction is caused at 40° C. to 100° C.; after the reaction is completed, the α-naphthol compound (and, if necessary, formaldehyde) is added and a reaction is caused under the temperature condition of 40° C. to 100° C. to provide a target polycondensate. In this case, when another novolac resin is also used, this resin is preferably added together with the α-naphthol compound to the reaction vessel.

After the reaction in the step 1 is completed, after the completion of the reaction, a neutralization treatment or a rinsing treatment is performed until the pH of the reaction mixture becomes 4 to 7. The neutralization treatment or the rinsing treatment may be performed in the standard manner. For example, an acidic substance such as acetic acid, phosphoric acid, or sodium phosphate may be used as a neutralizing agent. After the neutralization treatment or the rinsing treatment is performed, the organic solvent may be distilled off under reduced-pressure heating to provide the target polycondensate.

In the step 1 of the second method, predetermined amounts of the β-naphthol compound, the α-naphthol compound, formaldehyde, an organic solvent, an alkaline catalyst, and, in the case of additionally using another novolac resin, this novolac resin, are charged into a reaction vessel; a reaction is caused at 40° C. to 100° C. to provide a target polycondensate. In this case, when the other novolac resin is also used, this resin is preferably added together with the α-naphthol compound to the reaction vessel.

After the reaction in the step 1 is completed, after the completion of the reaction, a neutralization treatment or a rinsing treatment is performed until the pH of the reaction mixture becomes 4 to 7. The neutralization treatment or the rinsing treatment may be performed in the standard manner. For example, an acidic substance such as acetic acid, phosphoric acid, or sodium phosphate may be used as a neutralizing agent. After the neutralization treatment or the rinsing treatment is performed, the organic solvent may be distilled off under reduced-pressure heating to provide the target polycondensate.

Subsequently, in the step 2 of the first or second method, a reaction is caused between the polycondensate obtained in the step 1 and epihalohydrin to produce the target epoxy resin. Specifically, this step 2 may be performed in the following manner: epihalohydrin is added in an amount that is 2 to 10 times (in terms of mole) the number of moles of the phenolic hydroxyl groups of the polycondensate; and a reaction is caused at a temperature of 20° C. to 120° C. for 0.5 to 10 hours while a basic catalyst is further added at once or gradually in an amount that is 0.9 to 2.0 times (in terms of mole) the number of moles of the phenolic hydroxyl groups. This basic catalyst may be used in the form of solid or an aqueous solution thereof. In the case where this aqueous solution is used, the following process may be employed: while the aqueous solution is continuously added, water and epihalohydrin are continuously distilled off from the reaction mixture under a reduced pressure or normal pressure and are then subjected to separation so that water is removed and the epihalohydrin is continuously returned into the reaction mixture.

Note that, in industrial production, the epihalohydrin charged in the first batch of the production of the epoxy resin is entirely new. However, in the subsequent batches, the epihalohydrin collected from the crude reaction product is preferably used in combination with a new epihalohydrin in an amount corresponding to the amount decreased by consumption in the reaction. At this time, the epihalohydrin used is not particularly limited and may be, for example, epichlorohydrin, epibromohydrin, or β-methylepichlorohydrin. In particular, epichlorohydrin is preferred because it is industrially easily available.

Specific examples of the basic catalyst include alkaline-earth metal hydroxides, alkali metal carbonates, and alkali metal hydroxides. In particular, alkali metal hydroxides are preferred because of high catalytic activity for epoxy resin synthesis reaction. Examples of alkali metal hydroxides include sodium hydroxide and potassium hydroxide. Such a basic catalyst may be used in the form of an aqueous solution having a concentration of about 10% to about 55% by mass or in the form of solid. In addition, an organic solvent may also be used to increase the reaction rate in the synthesis of the epoxy resin. Such an organic solvent is not particularly limited and examples thereof include ketones such as acetone and methyl ethyl ketone; alcohol compounds such as methanol, ethanol, 1-propyl alcohol, isopropyl alcohol, 1-butanol, secondary-butanol, and tertiary-butanol; cellosolves such as methyl cellosolve and ethyl cellosolve; ether compounds such as tetrahydrofuran, 1,4-dioxane, 1,3-dioxane, and diethoxyethane; and aprotic polar solvents such as acetonitrile, dimethyl sulfoxide, and dimethylformamide. These organic solvents may be used alone or may be appropriately used in combination of two or more thereof for the purpose of adjusting the polarity.

After the reaction product of the above-described epoxidation reaction is rinsed, unreacted epihalohydrin and the organic solvent used together are distilled off by distillation under reduced-pressure heating. In order to provide an epoxy resin having a smaller content of hydrolyzable halogen, the obtained epoxy resin may be dissolved again in an organic solvent such as toluene, methyl isobutyl ketone, or methyl ethyl ketone and mixed with an aqueous solution of an alkali metal hydroxide such as sodium hydroxide or potassium hydroxide to thereby undergo a reaction. At this time, for the purpose of increasing the reaction rate, a correlation transfer catalyst such as a quaternary ammonium salt or a crown ether may be provided. In the case of using a phase transfer catalyst, the amount thereof used is preferably 0.1 to 3.0 parts by mass with respect to 100 parts by mass of the epoxy resin used. After the reaction is completed, the generated salt is removed by filtration, rinsing, or the like and the solvent such as toluene or methyl isobutyl ketone is further distilled off under reduced-pressure heating. As a result, a target epoxy resin according to the present invention can be obtained.

Next, a curable resin composition according to the present invention includes, as essential components, the epoxy resin having been described so far in detail and a curing agent.

Examples of the curing agent used here include amine-based compounds, amide-based compounds, acid anhydride-based compounds, and phenol-based compounds. Specifically, examples of the amine-based compounds include diaminodiphenylmethane, diethylenetriamine, triethylenetetramine, diaminodiphenyl sulfone, isophoronediamine, imidazole, $BF_3$-amine complexes, and guanidine derivatives. Examples of the amide-based compounds include dicyandiamide and polyamide resins synthesized from a dimer of linolenic acid and ethylenediamine. Examples of the acid anhydride-based compounds include phthalic anhydride, trimellitic anhydride, pyromellitic anhydride, maleic anhydride, tetrahydrophthalic anhydride, methyltetrahydrophthalic anhydride, methyl nadic anhydride, hexahydrophthalic anhydride, and methylhexahydrophthalic anhydride. Examples of the phenol-based compounds include polyphenol compounds such as phenol-novolac resins, cresol-novolac resins, aromatic hydrocarbon formaldehyde resin modified phenolic resins, dicyclopentadiene phenol adduct resins, phenol aralkyl resins (Xylok resins), polyphenol-novolac resins that are synthesized from polyhydroxy compounds and formaldehyde and represented by resorcin-novolac resins, naphthol aralkyl resins, trimethylolmethane resins, tetraphenylolethane resins, naphthol-novolac resins, naphthol-phenol cocondensation novolac resins, naphthol-cresol cocondensation novolac resins, biphenyl-modified phenolic resins (polyphenolic compounds in which phenolic nuclei are bonded through bismethylene groups), biphenyl-modified naphthol resins (polyhydric naphthol compounds in which phenolic nuclei are bonded through bismethylene groups), aminotriazine-modified phenolic resins (polyphenolic compounds in which phenolic nuclei are bonded through melamine, benzoguanamine, and the like), and alkoxy-group-containing aromatic-ring-modified novolac resins (polyphenolic compounds in which phenolic nuclei and alkoxy-group-containing aromatic rings are bonded through formaldehyde).

Of these, in particular, compounds having a large number of aromatic skeletons in the molecular structure are preferred in view of low thermal expansion. Specifically, the following are preferred because of very low thermal expansion: phenol-novolac resins, cresol-novolac resins, aromatic hydrocarbon formaldehyde resin modified phenolic resins, phenol aralkyl resins, resorcin-novolac resins, naphthol aralkyl resins, naphthol-novolac resins, naphthol-phenol cocondensation novolac resins, naphthol-cresol cocondensation novolac resins, biphenyl-modified phenolic resins, biphenyl-modified naphthol resins, aminotriazine-modified phenolic resins, and alkoxy-group-containing aromatic-ring-modified novolac resins (polyphenolic compounds in which phenolic nuclei and alkoxy-group-containing aromatic rings are bonded through formaldehyde).

The amounts of the epoxy resin and the curing agent mixed in a curable resin composition according to the present invention are not particularly limited. The amounts are preferably set such that the amount of active groups in the curing agent is 0.7 to 1.5 equivalents per equivalent of epoxy groups in total of the epoxy resin because the resultant cured product has good characteristics.

If necessary, a curable resin composition according to the present invention can appropriately include a curing accelerator. Such curing accelerators may be various curing accelerators and examples thereof include phosphorus compounds, tertiary amines, imidazole, metal salts of organic acids, Lewis acids, and amine complex salts. When the composition is particularly used in application to a semiconductor sealing material, a preferred phosphorus compound is triphenyl phosphine and a preferred tertiary amine is 1,8-diazabicyclo-[5.4.0]-undecene (DBU) in view of excellent curing properties, heat resistance, electric characteristics, moisture resistance reliability, and the like.

In a curable resin composition according to the present invention, the above-described epoxy resin according to the present invention alone may be used as the epoxy resin component. However, unless advantages of the present invention are not degraded, another epoxy resin may be used. Specifically, another epoxy resin may be additionally used such that the content of the above-described epoxy resin according to the present invention with respect to the total mass of the epoxy resin components is 30% by mass or more, preferably 40% by mass or more.

Here, the other epoxy resin that can be used in combination with the above-described epoxy resin may be selected from various epoxy resins. Example of the other epoxy resin include bisphenol A epoxy resins, bisphenol F epoxy resins, biphenyl epoxy resins, tetramethylbiphenyl epoxy resins, phenol-novolac epoxy resins, cresol-novolac epoxy resins, bisphenol A-novolac epoxy resins, triphenylmethane epoxy resins, tetraphenylethane epoxy resins, dicyclopentadiene-phenol addition reaction epoxy resins, phenol aralkyl epoxy resins, naphthol-novolac epoxy resins, naphthol aralkyl epoxy resins, naphthol-phenol cocondensation novolac epoxy resins, naphthol-cresol cocondensation novolac epoxy resins, aromatic hydrocarbon formaldehyde resin modified phenolic resin epoxy resins, and biphenyl novolac epoxy resins. Of these, in particular, preferred are phenol aralkyl epoxy resins, biphenyl novolac epoxy resins, naphthalene-skeleton-containing naphthol-novolac epoxy resins, naphthol aralkyl epoxy resins, naphthol-phenol cocondensation novolac epoxy resins, naphthol-cresol cocondensation novolac epoxy resins, crystalline biphenyl epoxy resins, tetramethylbiphenyl epoxy resins, xanthene epoxy resins, and alkoxy-group-containing aromatic-ring-modified novolac epoxy resins (compounds in which glycidyl-group-containing aromatic rings and alkoxy-group-containing aromatic rings are bonded through formaldehyde) because cured products having high heat resistance can be obtained.

As described above, a curable resin composition according to the present invention having been described so far in detail exhibits excellent solvent solubility. Accordingly, the curable resin composition preferably contains, in addition to the above-described components, an organic solvent. Examples of the organic solvent that can be used here include methyl ethyl ketone, acetone, dimethylformamide, methyl isobutyl ketone, methoxy propanol, cyclohexanone, methyl cellosolve, ethyl diglycol acetate, and propylene glycol monomethyl ether acetate. The selection of the solvent and the appropriate amount of the solvent used can be appropriately determined on the basis of an application. For example, in applications to printed wiring boards, polar solvents having a boiling point of 160° C. or less such as methyl ethyl ketone, acetone, and dimethylformamide are preferred and the polar solvents are preferably used such that a non-volatile content is 40% to 80% by mass. On the other hand, in applications to adhesive films for build-up, preferred examples of the organic solvent include ketones such as acetone, methyl ethyl ketone, and cyclohexanone; acetate such as ethyl acetate, butyl acetate, cellosolve acetate, propylene glycol monomethyl ether acetate, and carbitol acetate; carbitols such as cellosolve and butyl carbitol; aromatic hydrocarbons such as toluene and xylene; dimethylformamide, dimethylacetamide, and N-methylpyrrolidone. In addition, the organic solvent is preferably used such that a non-volatile content is 30% to 60% by mass.

In order to make the thermally curable resin composition exhibit fire retardancy, the thermally curable resin composition may be made to contain a non-halogen fire retardant that substantially contains no halogen atoms in, for example, the field of printed wiring boards as long as reliability is not degraded.

Examples of the non-halogen fire retardant include phosphorus fire retardants, nitrogen fire retardants, silicone fire retardants, inorganic fire retardants, and organic metal salt fire retardants. Use of these fire retardants is not limited at all. The fire retardants may be used alone, in combination of fire retardants of the same type, or in combination of fire retardants of different types.

As the phosphorus fire retardants, inorganic and organic fire retardants can be used. Examples of such inorganic compounds include red phosphorus and inorganic nitrogen-containing phosphorus compounds such as ammonium phosphates (e.g., monoammonium phosphate, diammonium phosphate, triammonium phosphate, and ammonium polyphosphate) and phosphoric acid amide.

The red phosphorus is preferably surface-treated for the purpose of suppressing hydrolysis and the like. Examples of such a surface treatment method include (i) a method of applying an inorganic compound such as magnesium hydroxide, aluminum hydroxide, zinc hydroxide, titanium hydroxide, bismuth oxide, bismuth hydroxide, bismuth nitrate, or a mixture of the foregoing; (ii) a method of applying a mixture of an inorganic compound such as magnesium hydroxide, aluminum hydroxide, zinc hydroxide, or titanium hydroxide, and a thermosetting resin such as a phenolic resin; and (iii) a method of applying a thermosetting resin such as a phenolic resin to a coating of an inorganic compound such as magnesium hydroxide, aluminum hydroxide, zinc hydroxide, or titanium hydroxide to provide double coatings.

Examples of the organic phosphorus compounds include, in addition to general-purpose organic phosphorus compounds such as phosphoric ester compounds, phosphonic acid compounds, phosphinic acid compounds, phosphine oxide compounds, phospholan compounds, and organic nitrogen-containing phosphorus compounds, cyclic organic phosphorus compounds such as 9,10-dihydro-9-oxa-10-phosphaphenanthrene=10-oxide, 10-(2,5-dihydroxyphenyl)-10H-9-oxa-10-phosphaphenanthrene=10-oxide, and 10-(2,7-dihydroxynaphthyl)-10H-9-oxa-10-phosphaphenanthrene=10-oxide, and derivatives obtained by reactions between the cyclic organic phosphorus compounds and compounds such as epoxy resins and phenolic resins.

The amount of a phosphorus fire retardant added is appropriately selected on the basis of the type of the phosphorus fire retardant, other components in the curable resin composition, and a desired degree of fire retardancy. For example, in 100 parts by mass of a curable resin composition containing all the components such as an epoxy resin, a curing agent, a non-halogen fire retardant, and other filler and additive, when red phosphorus is used as a non-halogen fire retardant, red phosphorus is preferably added in the range of 0.1 to 2.0 parts by mass. Similarly, when an organic phosphorus compound is used, the organic phosphorus compound is preferably added in the range of 0.1 to 10.0 parts by mass, particularly preferably, in the range of 0.5 to 6.0 parts by mass.

When the phosphorus fire retardant is used, the phosphorus fire retardant may be used together with hydrotalcite, magnesium hydroxide, boride compounds, zirconium oxide, black dyes, calcium carbonate, zeolite, zinc molybdate, activated carbon, or the like.

Examples of the nitrogen fire retardants include triazine compounds, cyanuric acid compounds, isocyanuric acid compounds, and phenothiazine; and preferred are triazine compounds, cyanuric acid compounds, and isocyanuric acid compounds.

Examples of the triazine compounds include, in addition to melamine, acetoguanamine, benzoguanamine, melon, melam, succinoguanamine, ethylenedimelamine, melamine polyphosphate, triguanamine, and the like, (i) aminotriazine sulfate compounds such as guanylmelamine sulfate, melem sulfate, and melam sulfate; (ii) co-condensates of phenols such as phenol, cresol, xylenol, butylphenol, and nonylphenol, melamines such as melamine, benzoguanamine, acetoguanamine, and formguanamine, and formaldehyde; (iii) mixtures of the co-condensates (ii) and phenolic resins such as phenol-formaldehyde condensates; and (iv) compounds obtained by further modifying (ii) and (iii) with tung oil, isomerized linseed oil, or the like.

Specific examples of the cyanuric acid compounds include cyanuric acid and melamine cyanurate.

The amount of such a nitrogen fire retardant added is appropriately selected on the basis of the type of the nitrogen fire retardant, other components in the curable resin composition, and a desired degree of fire retardancy. For example, in 100 parts by mass of a curable resin composition containing all the components such as an epoxy resin, a curing agent, a non-halogen fire retardant, and other filler and additive, the nitrogen fire retardant is preferably added in the range of 0.05 to 10 parts by mass, particularly preferably, in the range of 0.1 to 5 parts by mass.

Such a nitrogen fire retardant may be used together with a metal hydroxide, a molybdenum compound, or the like.

The silicone fire retardants are not particularly limited as long as the silicone fire retardants are organic compounds having silicon atoms. Examples of the silicone fire retardants include silicone oils, silicone rubbers, and silicone resins.

The amount of such a silicone fire retardant added is appropriately selected on the basis of the type of the silicone fire retardant, other components in the curable resin composition, and a desired degree of fire retardancy. For example, in 100 parts by mass of a curable resin composition containing all the components such as an epoxy resin, a curing agent, a non-halogen fire retardant, and other filler and additive, the silicone fire retardant is preferably added in the range of 0.05 to 20 parts by mass. Such a silicone fire retardant may be used together with a molybdenum compound, alumina, or the like.

Examples of the inorganic fire retardants include metal hydroxides, metal oxides, metal carbonate compounds, metal powders, boron compounds, and low-melting glass.

Specific examples of the metal hydroxides include aluminum hydroxide, magnesium hydroxide, dolomite, hydrotalcite, calcium hydroxide, barium hydroxide, and zirconium hydroxide.

Specific examples of the metal oxides include zinc molybdate, molybdenum trioxide, zinc stannate, tin oxide, aluminum oxide, iron oxide, titanium oxide, manganese oxide, zirconium oxide, zinc oxide, molybdenum oxide, cobalt oxide, bismuth oxide, chromium oxide, nickel oxide, copper oxide, and tungsten oxide.

Specific examples of the metal carbonate compounds include zinc carbonate, magnesium carbonate, calcium carbonate, barium carbonate, basic magnesium carbonate, aluminum carbonate, iron carbonate, cobalt carbonate, and titanium carbonate.

Specific examples of the metal powders include powders of aluminum, iron, titanium, manganese, zinc, molybdenum, cobalt, bismuth, chromium, nickel, copper, tungsten, and tin.

Specific examples of the boron compounds include zinc borate, zinc metaborate, barium metaborate, boric acid, and borax.

Specific examples of the low-melting glass include CEEPREE (Bokusui Brown Co., Ltd.), hydrated glass $SiO_2$—$MgO$—$H_2O$, and glass compounds of $PbO$—$B_2O_3$, $ZnO$—$P_2O_5$—$MgO$, $P_2O_5$—$B_2O_3$—$PbO$—$MgO$, P—Sn—O—F, $PbO$—$V_2O_5$—$TeO_2$, $Al_2O_3$—$H_2O$, and lead borosilicate.

The amount of such an inorganic fire retardant added is appropriately selected on the basis of the type of the inorganic fire retardant, other components in the curable resin composition, and a desired degree of fire retardancy. For example, in 100 parts by mass of a curable resin composition containing all the components such as an epoxy resin, a curing agent, a non-halogen fire retardant, and other filler and additive, the inorganic fire retardant is preferably added in the range of 0.05 to 20 parts by mass, particularly preferably, in the range of 0.5 to 15 parts by mass.

Examples of the organic metal salt fire retardants include ferrocene, acetylacetonato metal complexes, organic metal carbonyl compounds, organic cobalt salt compounds, organic metal sulfonate salts, and compounds in which metal atoms and aromatic compounds or heterocyclic compounds are bonded through ionic bonds or coordinate bonds.

The amount of such an organic metal salt fire retardant added is appropriately selected on the basis of the type of the organic metal salt fire retardant, other components in the curable resin composition, and a desired degree of fire retardancy. For example, in 100 parts by mass of a curable resin composition containing all the components such as an epoxy resin, a curing agent, a non-halogen fire retardant, and other filler and additive, the organic metal salt fire retardant is preferably added in the range of 0.005 to 10 parts by mass.

A curable resin composition according to the present invention may optionally contain an inorganic filler. Examples of the inorganic filler include fused silica, crystalline silica, alumina, silicon nitride, and aluminum hydroxide. When the amount of such an inorganic filler added is made particularly large, fused silica is preferably used. The fused silica may be used in the form of fragments or spheres. In order to increase the amount of fused silica added and to suppress an increase in the melt viscosity of the molding composition, fused silica in the form of spheres is preferably mainly used. Furthermore, in order to increase the amount of spherical silica added, the size distribution of spherical silica particles is preferably appropriately adjusted. The filling factor of the filler is preferably high in view of fire retardancy and particularly preferably 20% by mass or more relative to the entire amount of the curable resin composition. In applications to conductive paste and the like, a conductive filler such as silver powder or copper powder may be used.

A curable resin composition according to the present invention may optionally contain various additives such as a silane coupling agent, a release agent, a pigment, and an emulsifying agent.

A curable resin composition according to the present invention can be obtained by uniformly mixing the above-described components. A curable resin composition according to the present invention containing an epoxy resin according to the present invention, a curing agent, and optionally a curing accelerator can be readily turned into a cured product by a method similar to known methods. Examples of such cured products are formed cured products such as multilayer products, cast products, adhesive layers, coatings, and films.

Examples of applications of a curable resin composition according to the present invention include printed wiring board materials, resin casting materials, adhesives, interlayer insulating materials for build-up boards, and adhesive films for build-up. Of these various applications, in the applications to printed wiring boards, insulating materials for electronic circuit boards, and adhesive films for build-up, the curable resin composition can be used as insulating materials for boards within which passive components such as capacitors and active components such as IC chips are embedded, so-called electronic-component built-in boards. Of these, the curable resin composition has characteristics of less change in the heat resistance due to thermal history, low thermal expansion, and solvent solubility and hence is preferably used for printed wiring board materials and adhesive films for build-up.

Here, a printed circuit board can be produced with a curable resin composition according to the present invention by impregnating a curable resin composition in the form of varnish containing the organic solvent into a reinforcing base and by subjecting a laminate of the reinforcing base and a copper foil to thermocompression bonding. Examples of the reinforcing base that can be used herein include paper, glass cloth, glass nonwoven fabric, aramid paper, aramid cloth, glass mat, and glass roving cloth. Such a method will be described in further detail. The curable resin composition that is in the form of varnish is first heated to a heating temperature according to the type of a solvent used, preferably to 50° C. to 170° C., to provide prepregs that are cured products. The proportions of the resin composition and the reinforcing bases by mass that are used herein are not particularly limited, but the proportions are generally preferably adjusted such that the resin content in the prepregs is 20% to 60% by mass. The thus-obtained prepregs are then stacked in a standard manner and appropriately laminated to copper foils and the resultant laminate is subjected to thermocompression bonding under a pressure of 1 to 10 MPa at 170° C. to 250° C. for 10 minutes to 3 hours to thereby provide a target printed circuit board.

When a curable resin composition according to the present invention is used as a resist ink, for example, there is a method in which a cationic polymerization catalyst is used as a curing agent for the curable resin composition; the curable resin composition is further mixed with pigment, talc, and filler to prepare a resist-ink composition; and the resist-ink composition is then applied to a printed board by the screen printing method and subsequently turned into a resist-ink cured product.

When a curable resin composition according to the present invention is used as a conductive paste, for example, there are a method in which fine conductive particles are dispersed in the curable resin composition to provide a composition for an anisotropic conductive film and a method in which the curable resin composition is turned into a resin composition paste for circuit connection or an anisotropic conductive adhesive, the resin composition paste and the anisotropic conductive adhesive being in the form of liquid at room temperature.

An interlayer insulating material for build-up boards is produced from a curable resin composition according to the present invention by, for example, the following method. The curable resin composition appropriately containing rubber, filler, and the like is applied to a wiring board in which circuits are formed by a spray coating method, a curtain coating method, or the like and is subsequently cured. Holes are then optionally formed in predetermined through-hole portions and the like. The board is subsequently treated with a roughening agent and a surface thereof is rinsed with hot water to thereby form irregularities. The board is plated with a metal such as copper. The plating method is preferably electroless plating or electrolytic plating. Examples of the roughening agent include an oxidizing agent, an alkali, and an organic solvent. Such a procedure is sequentially repeated as needed to alternately build up a resin insulating layer and a conductor layer having a predetermined circuit pattern. As a result, a build-up board can be provided. Note that holes are formed in the through-hole portions after the formation of a resin insulating layer serving as an outermost layer. Alternatively, a build-up board can be produced without the step of formation of a roughened surface and plating as follows: a copper foil with a resin in which the resin composition is semi-cured on the copper foil is bonded to a wiring board in which circuits are formed, by thermocompression bonding at 170° C. to 250° C.

As for a method for producing an adhesive film for build-up from a curable resin composition according to the present invention, for example, there is a method in which a curable resin composition according to the present invention is applied to a support film to form a resin composition layer to provide an adhesive film for a multilayer printed wiring board.

When a curable resin composition according to the present invention is used for an adhesive film for build-up, it is important that the adhesive film softens under a lamination temperature condition (generally 70° C. to 140° C.) in a vacuum lamination method and exhibits such a fluidity (resin flow) that via holes or through-holes in a circuit board can be filled with the resin at the same time as lamination of the circuit board. The above-described components are preferably mixed so that such characteristics are exhibited.

Herein, through-holes in multilayer printed wiring boards generally have a diameter of 0.1 to 0.5 mm and a depth of 0.1 to 1.2 mm and through-holes satisfying these ranges are preferably generally filled with the resin. Note that, when lamination is performed on both surfaces of a circuit board, through-holes are desirably filled to about half of the through-holes.

Specifically, the above-described method for producing an adhesive film can be performed as follows. A curable resin composition in the form of varnish according to the present invention is prepared. The varnish composition is then applied to a surface of a support film (Y) and the organic solvent is subsequently removed by heating, hot-air blowing, or the like to form a layer (X) of the curable resin composition.

The formed layer (X) generally has a thickness equal to or larger than the thickness of a conductor layer. Since a circuit board generally has a conductor layer with a thickness in the range of 5 to 70 μm, the resin composition layer preferably has a thickness of 10 to 100 μm.

Note that, in the present invention, the layer (X) may be covered with a protective film described below. By protecting the surface of the resin composition layer with a protective film, adhesion of dust or the like and scratching in the surface can be suppressed.

The above-described support film and the protective film may be composed of, for example, a polyolefin such as polyethylene, polypropylene, or polyvinyl chloride; a polyester such as polyethylene terephthalate (hereafter, sometimes abbreviated as "PET") or polyethylene naphthalate; polycarbonate; polyimide; release paper; or a metal foil such as a copper foil or an aluminum foil. Note that the support film and the protective film may be subjected to a mat treatment, a corona treatment, and a release treatment.

The thickness of the support film is not particularly limited and is generally 10 to 150 μm, preferably in the range of 25 to 50 μm. The protective film preferably has a thickness of 1 to 40 μm.

The above-described support film (Y) is released after lamination to a circuit board or after the formation of an insulating layer by heat-curing. By releasing the support film (Y) after the adhesion film is heat-cured, adhesion of dust or the like in the curing step can be suppressed. When the support film is released after the curing, the support film is generally subjected to a release treatment in advance.

Next, a method for producing a multilayer printed wiring board with the thus-obtained adhesive film is performed by, for example, in the cases where the layer (X) is protected with a protective film, removing the protective film and performing lamination such that the layer (X) is in direct contact with a single surface or both surfaces of a circuit board by, for example, a vacuum lamination method. The lamination may be performed by a batch process or a continuous process with rollers. The adhesive film and the circuit board may be optionally heated (preheated) before the lamination.

As for lamination conditions, lamination is preferably performed at a compression bonding temperature (lamination temperature) of 70° C. to 140° C., at a compression bonding pressure of 1 to 11 kgf/cm$^2$ (9.8×104 to 107.9×10$^4$ N/m2), and under a reduced air pressure of 20 mmHg (26.7 hPa) or less.

The method for providing a cured product according to the present invention may be performed in accordance with a general method for curing a curable resin composition. For example, heating-temperature conditions may be appropriately selected in accordance with the type of a curing agent combined, an application, or the like. The composition obtained by the above-described method may be heated in a temperature range of about 20° C. to about 250° C.

Accordingly, by using the epoxy resin, the solvent solubility of the epoxy resin is considerably enhanced and the resultant cured product is less changed in terms of heat resistance due to thermal history and has a low thermal expansion coefficient. Thus, the epoxy resin can be applied to the most advanced printed wiring board materials. In addition, the epoxy resin can be efficiently readily produced by a production method according to the present invention and molecular design according to the level of the above-described target properties can be performed.

EXAMPLES

Hereinafter, the present invention will be specifically described with reference to Examples and Comparative examples. In the description below, "parts" and "%" are based on mass unless otherwise specified. Note that melt viscosity at 150° C., GPC, NMR, and MS spectra were measured under the following conditions.
1) Softening-point measurement method: JIS K7234
2) GPC: measurement conditions are as follows.
  Measurement apparatus: "HLC-8220 GPC", manufactured by Tosoh Corporation
  Columns: guard column "HXL-L", manufactured by Tosoh Corporation,
    "TSK-GEL G2000HXL", manufactured by Tosoh Corporation,
    "TSK-GEL G2000HXL", manufactured by Tosoh Corporation,
    "TSK-GEL G3000HXL", manufactured by Tosoh Corporation,
    "TSK-GEL G4000HXL", manufactured by Tosoh Corporation
  Detector: RI (differential refractometer)
  Data processing: "GPC-8020 Model II version 4.10", manufactured by Tosoh Corporation
Measurement Conditions:
  Column temperature 40° C.
  Developing solvent tetrahydrofuran
  Flow rate 1.0 ml/min
  Standards: the following monodisperse polystyrenes whose molecular weights are known were used in compliance with the measurement manual of the "GPC-8020 Model II version 4.10".
    (Used Polystyrenes)
    "A-500", manufactured by Tosoh Corporation
    "A-1000", manufactured by Tosoh Corporation
    "A-2500", manufactured by Tosoh Corporation
    "A-5000", manufactured by Tosoh Corporation
    "F-1", manufactured by Tosoh Corporation
    "F-2", manufactured by Tosoh Corporation
    "F-4", manufactured by Tosoh Corporation
    "F-10", manufactured by Tosoh Corporation
    "F-20", manufactured by Tosoh Corporation
    "F-40", manufactured by Tosoh Corporation
    "F-80", manufactured by Tosoh Corporation
    "F-128", manufactured by Tosoh Corporation
  Sample: 1.0% by mass tetrahydrofuran solution (50 μl) in terms of resin solid content prepared by filtration through a microfilter
3) $^{13}$C-NMR: measurement conditions are as follows.
  Apparatus: AL-400, manufactured by JEOL Ltd.
  Measurement mode: SGNNE (1H complete decoupling technique without NOE)
  Solvent: dimethyl sulfoxide
  Pulse angle: 45° C. pulse
  Sample concentration: 30 wt %
  Number of transients: 10000
4) MS: JMS-T100GC, manufactured by JEOL Ltd.

Example 1

A flask equipped with a thermometer, a dropping funnel, a condenser, a fractional distillation column, and a stirrer was charged with 144 parts of β-naphthol (1.0 mol), 150 parts of isopropyl alcohol, 130 parts of 37% formalin aqueous solution (1.6 mol), and 41 parts of 49% sodium hydroxide (0.5 mol). This mixture was heated from room temperature to 80° C. under stirring and stirred at 80° C. for an hour. Subsequently, 144 parts of α-naphthol (1.0 mol) was added and the mixture was further stirred at 80° C. for an hour. After the reaction was completed, the reaction solution was neutralized by addition of 60 parts by mass of sodium phosphate. The reaction solution was then mixed with 600 parts of methyl isobutyl ketone, washed three times with 150 parts by mass of water, and then dried under reduced-pressure heating to provide 290 parts by mass of a naphthol resin (B-1). The obtained naphthol resin (B-1) had a hydroxyl equivalent weight of 153 g/eq.

Figure 2:
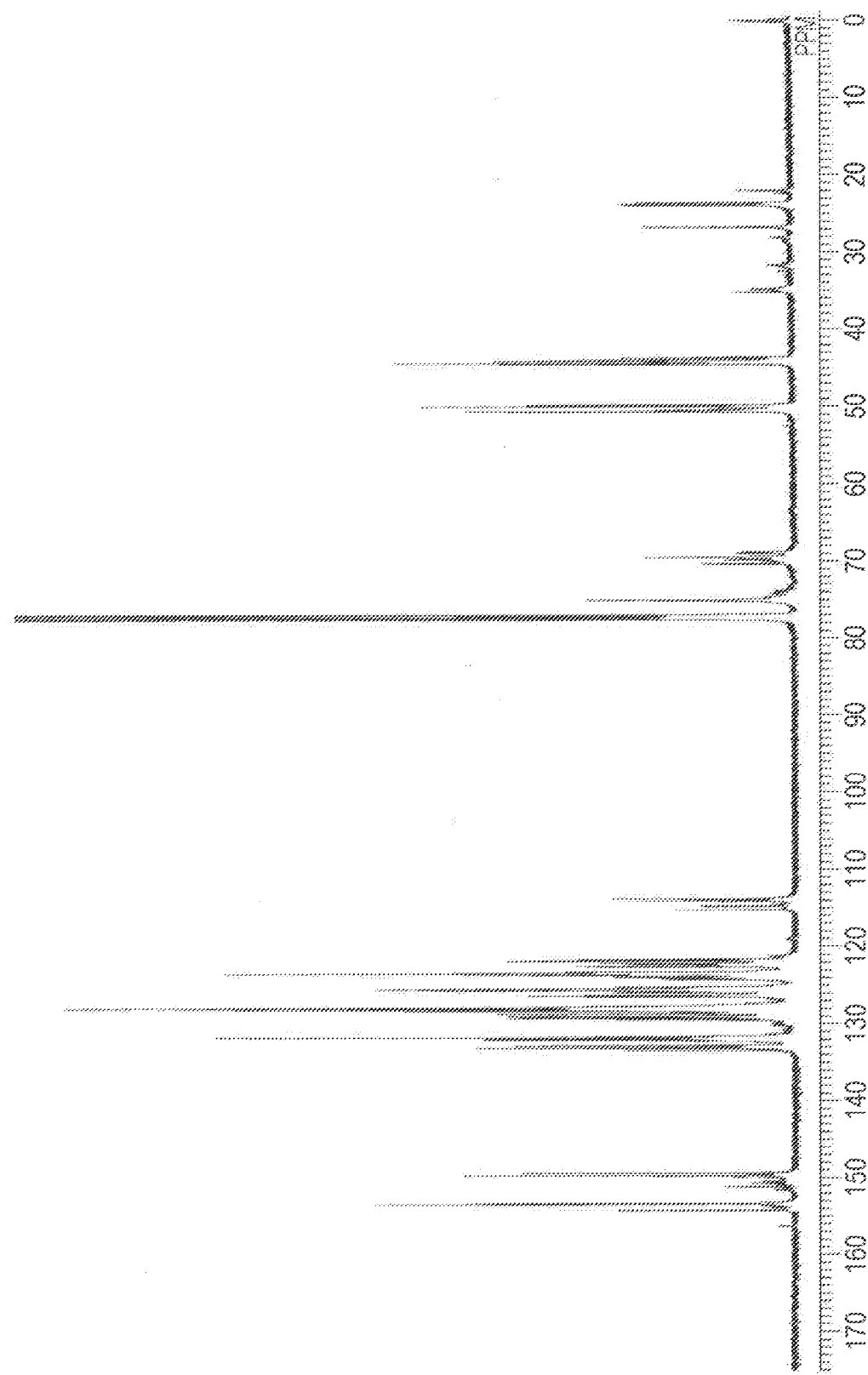
FIG. 2 is a $C^{13}$ NMR chart of an epoxy resin (A-1) obtained in Example 1.
Figure 3:
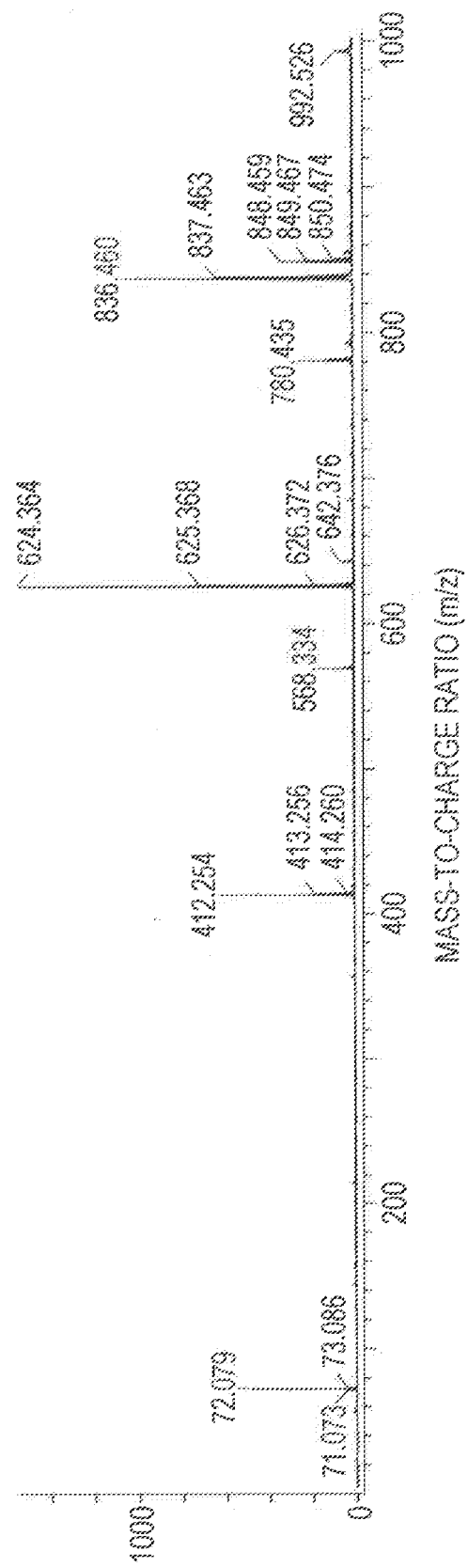
FIG. 3 is a MS spectrum of an epoxy resin (A-1) obtained in Example 1.

Subsequently, a flask equipped with a thermometer, a condenser, and a stirrer was charged with, under nitrogen-gas purging, 153 parts by mass (hydroxyl group 1.0 equivalent) of the naphthol resin (B-1) obtained in the above-described reaction, 463 parts by mass of epichlorohydrin (5.0 mol), and 53 parts by mass of n-butanol. The resin was dissolved under stirring. This solution was heated to 50° C. To this solution, 220 parts by mass of a 20% aqueous solution of sodium hydroxide (1.10 mol) was then added over three hours and a reaction subsequently proceeded at 50° C. for an hour. After the reaction was completed, stirring was stopped and the underlying aqueous layer was removed. Stirring was resumed and unreacted epichlorohydrin was distilled off at 150° C. under a reduced pressure. The resultant crude epoxy resin was dissolved by addition of 300 parts by mass of methyl isobutyl ketone and 50 parts by mass of n-butanol. To this solution, 15 parts by mass of a 10 mass % aqueous solution of sodium hydroxide was further added and a reaction proceeded at 80° C. for 2 hours. The resultant content was rinsed three times with 100 parts by mass of water until the pH of the rinse liquid became neutral. Subsequently, the system was dehydrated by azeotropy and subjected to microfiltration. After that, the solvent was distilled off under a reduced pressure to provide 200 parts by mass of a target epoxy resin (A-1). The obtained epoxy resin (A-1) had an epoxy equivalent weight of 234 g/eq and a softening point of 113° C. The GPC chart is shown in FIG. 1. The NMR chart is shown in FIG. 2. The MASS chart is shown in FIG. 3. From the GPC chart, the trimer (x1) had a content of 25.3%, the dimer (x2) had a content of 5.3%, the calixarene compound (x3) had a content of 7.4%, and the high-molecular-weight component (x4) had a content of 62.0%.

Example 2

Figure 4:
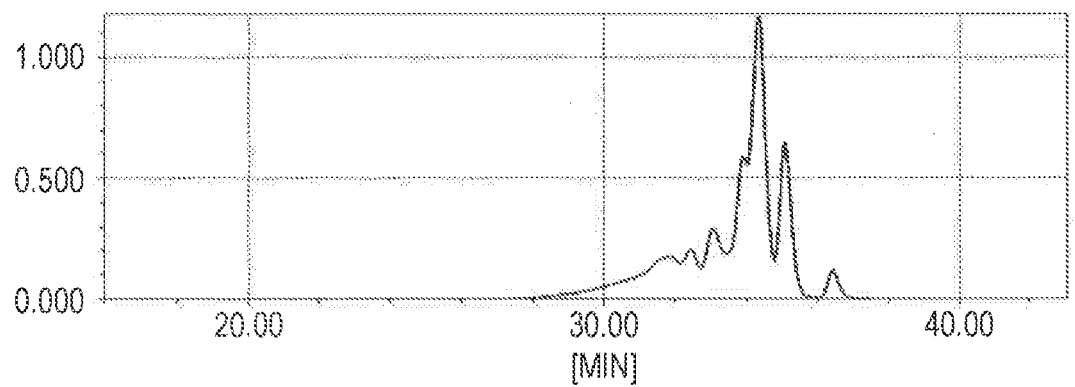
FIG. 4 is a GPC chart of an epoxy resin (A-2) obtained in Example 2.

An epoxy resin (A-2) (200 parts by mass) was obtained as in Example 1 except that the amounts were changed to 72 parts of β-naphthol (0.5 mol), 130 parts of isopropyl alcohol, 142 parts of 37% formalin aqueous solution (1.75 mol), and 24 parts of 49% sodium hydroxide (0.3 mol). The obtained epoxy resin (A-2) had an epoxy equivalent weight of 242 g/eq and a softening point of 134° C. The GPC chart is shown in FIG. 4. From the GPC chart, the trimer (x1) had a content of 15.8%, the dimer (x2) had a content of 3.0%, the calixarene compound (x3) had a content of 33.0%, and the high-molecular-weight component (x4) had a content of 48.2%.

Example 3

A flask equipped with a thermometer, a dropping funnel, a condenser, a fractional distillation column, and a stirrer was charged with 115 parts of β-naphthol (0.80 mol), 173 parts of α-naphthol (1.20 mol), 54 parts by mass of a cresol-novolac resin having a softening point of 75° C. (B&R method) (the number of moles of the cresol skeleton: 0.45 mol), 150 parts of isopropyl alcohol, 135 parts of 37% formalin aqueous solution (1.66 mol), and 5 parts of 49% sodium hydroxide (0.06 mol). This mixture was heated from room temperature to 80° C. under stirring and stirred at 80° C. for two hours. After the reaction was completed, the reaction solution was neutralized by addition of 10 parts by mass of sodium phosphate. The reaction solution was then mixed with 727 parts of methyl isobutyl ketone, washed three times with 182 parts by mass of water, and then dried under reduced-pressure heating to provide 350 parts by mass of a naphthol resin (B-2). The obtained naphthol resin (B-2) had a hydroxyl equivalent weight of 148 g/eq.

Figure 5:
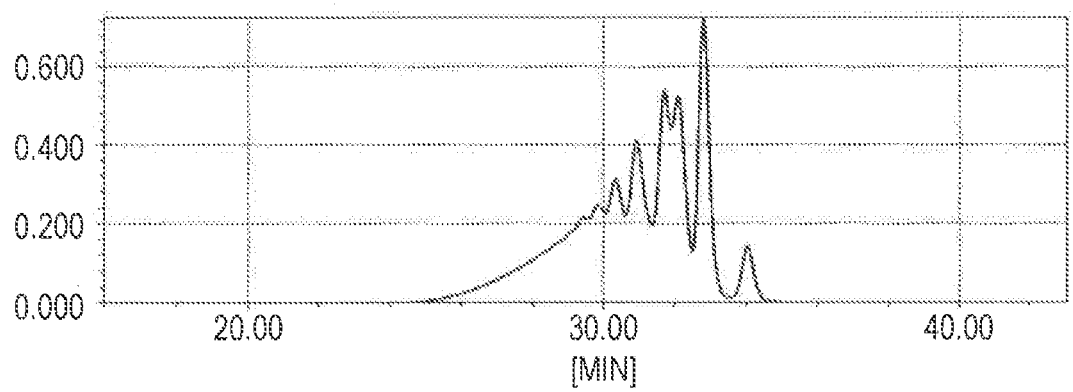
FIG. 5 is a GPC chart of an epoxy resin (A-3) obtained in Example 3.

The epoxidation step was performed as in Example 1 to provide 204 parts by mass of a target epoxy resin (A-3). The obtained epoxy resin (A-3) had an epoxy equivalent weight of 230 g/eq and a softening point of 112° C. The GPC chart is shown in FIG. 5. From the GPC chart, the trimer (x1) had a content of 16.8%, the dimer (x2) had a content of 3.7%, the calixarene compound (x3) had a content of 13.4%, and the high-molecular-weight component (x4) had a content of 66.1%.

Example 4

Figure 6:
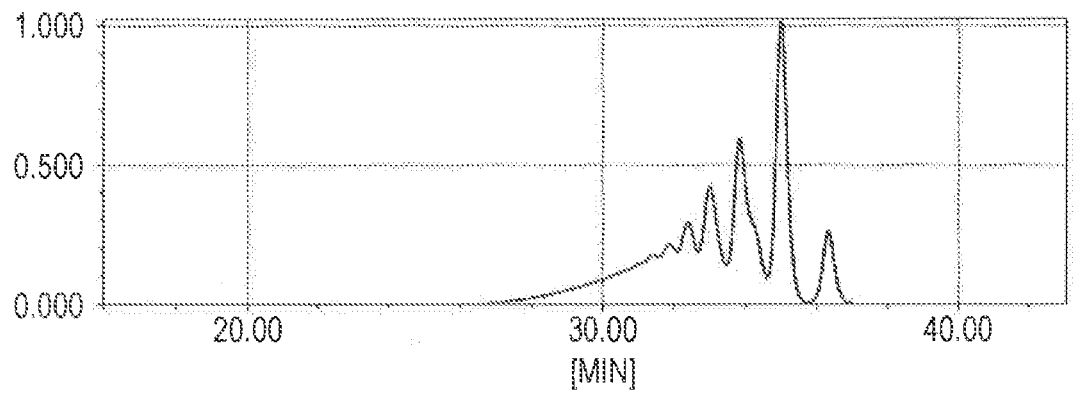
FIG. 6 is a GPC chart of an epoxy resin (A-4) obtained in Example 4.
Figure 7:
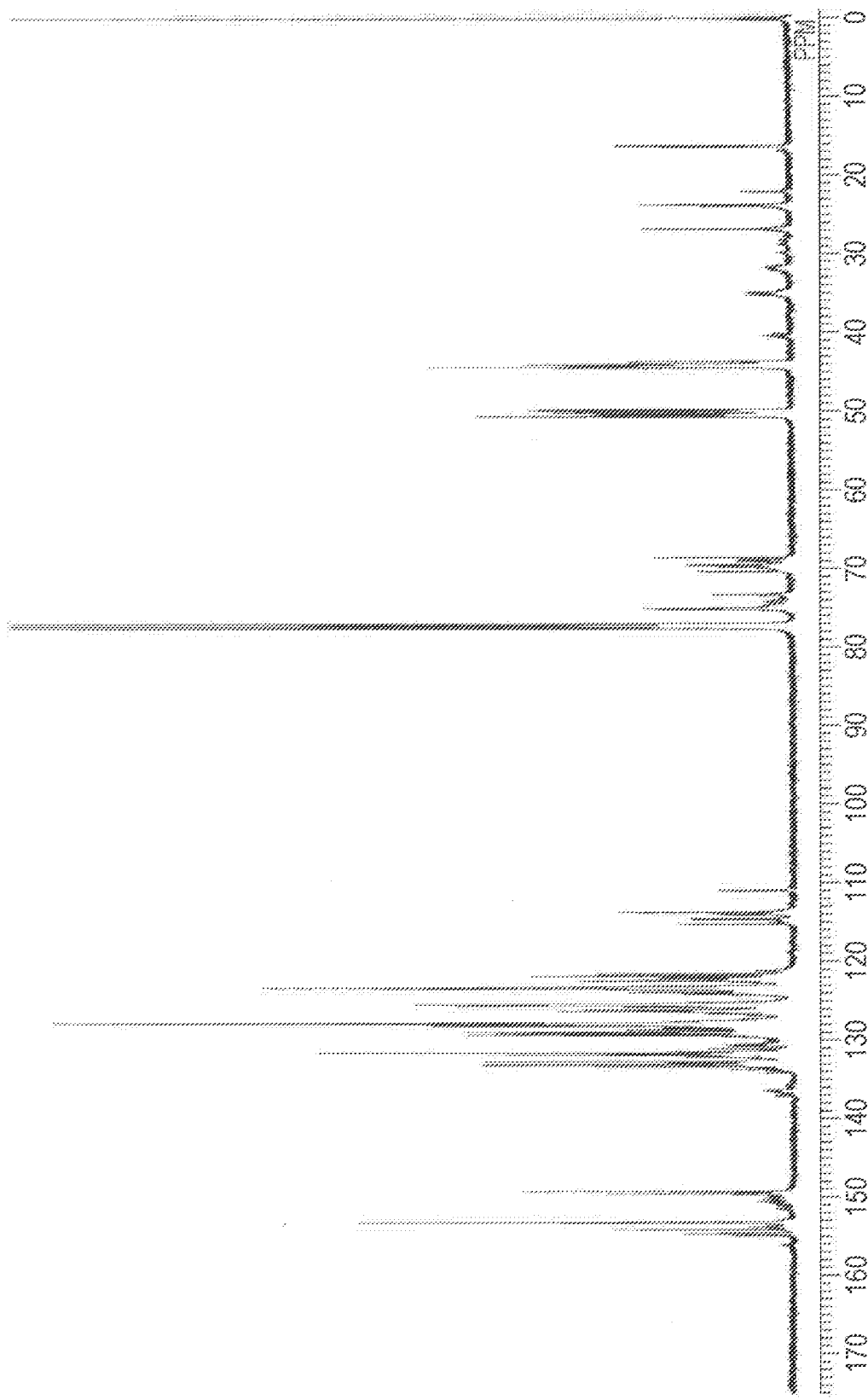
FIG. 7 is a $C^{13}$ NMR chart of an epoxy resin (A-4) obtained in Example 4.
Figure 8:
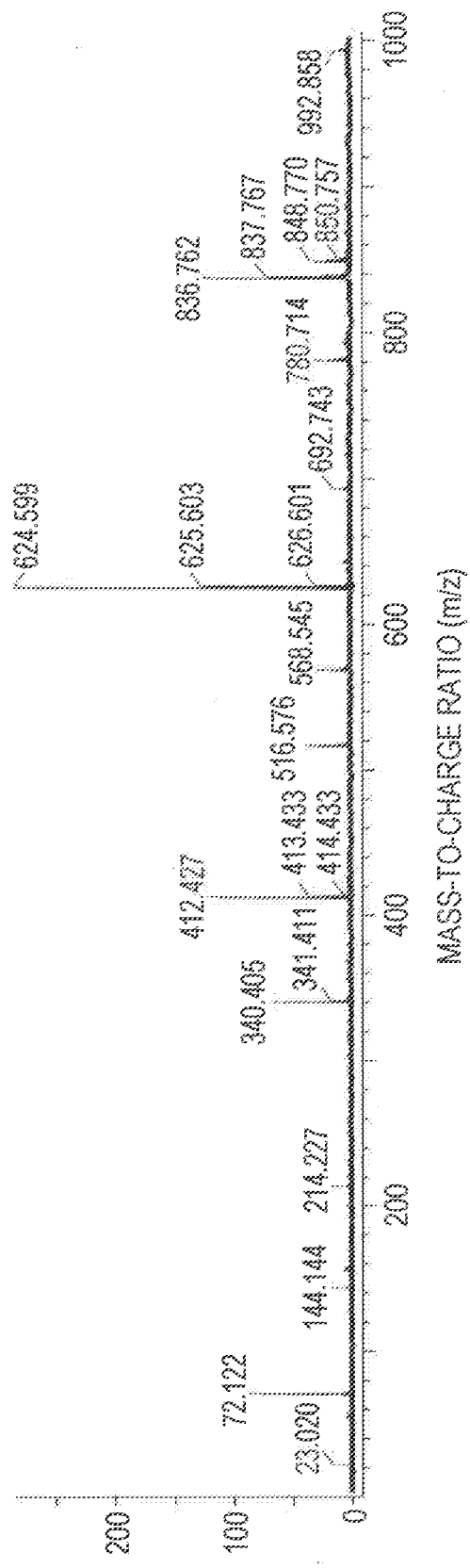
FIG. 8 is a MS spectrum of an epoxy resin (A-4) obtained in Example 4.

An epoxy resin (A-4) (197 parts by mass) was obtained as in Example 3 except that the amounts were changed to 144 parts of β-naphthol (1.00 mol) and 144 parts of α-naphthol (1.00 mol). The obtained epoxy resin (A-4) had an epoxy equivalent weight of 228 g/eq and a softening point of 103° C. The GPC chart is shown in FIG. 6. The NMR chart is shown in FIG. 7. The MASS chart is shown in FIG. 8. From the GPC chart, the trimer (x1) had a content of 23.9%, the dimer (x2) had a content of 6.5%, the calixarene compound (x3) had a content of 5.5%, and the high-molecular-weight component (x4) had a content of 64.1%.

Comparative Synthesis Example 1

A flask equipped with a thermometer, a dropping funnel, a condenser, a fractional distillation column, and a stirrer was charged with 505 parts by mass of α-naphthol (3.50 mol), 158 parts by mass of water, and 5 parts by mass of oxalic acid. This mixture was heated from room temperature to 100° C. over 45 minutes under stirring. Subsequently, to this solution, 177 parts by mass of 42 mass % formalin aqueous solution (2.45 mol) was dropped over an hour. After the dropping was completed, the solution was further stirred at 100° C. for an hour and then heated to 180° C. over three hours. After the reaction was completed, the water content remaining in the reaction system was removed under reduced-pressure heating to provide 498 parts by mass of a naphthol resin (B-3). The obtained naphthol resin (B-3) had a hydroxyl equivalent weight of 154 g/eq.

Figure 9:
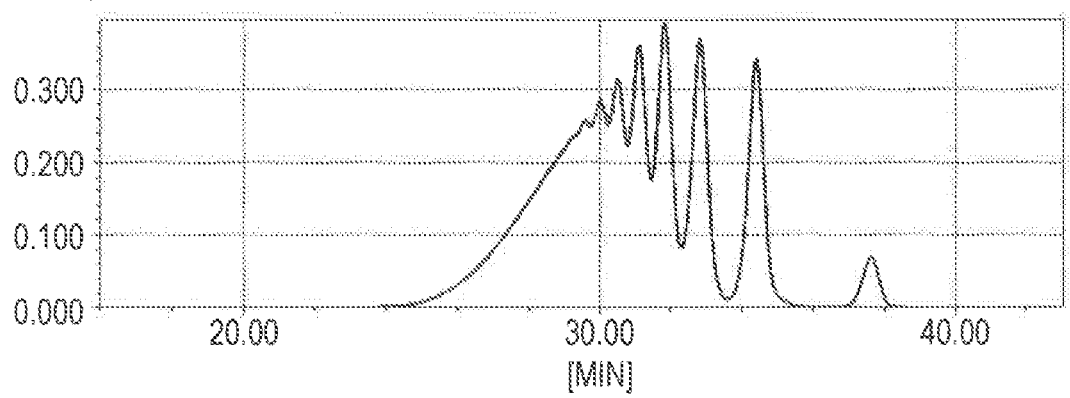
FIG. 9 is a GPC chart of an epoxy resin (A-5) obtained in Comparative synthesis example 1.

Subsequently, in a flask equipped with a thermometer, a condenser, and a stirrer, under nitrogen-gas purging, 154 parts by mass (hydroxyl group 1.0 equivalent) of the naphthol resin (B-3) obtained in the above-described reaction was treated as in Example 1 to provide 202 parts by mass of an epoxy resin (A-5). The obtained epoxy resin (A-5) had an epoxy equivalent weight of 237 g/eq. The GPC chart is shown in FIG. 9. From the GPC chart, the trimer (x1), the dimer (x2), and the calixarene compound (x3) each had a content of 0.0%.

Comparative Synthesis Example 2

Figure 10:
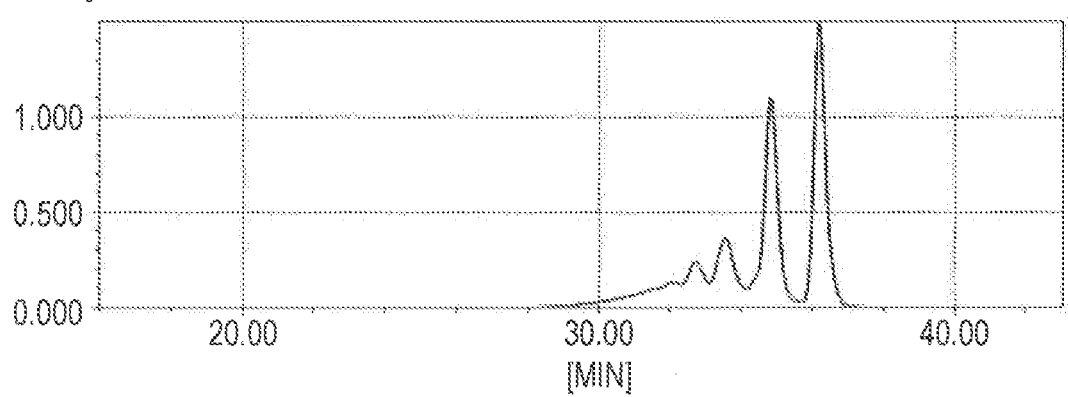
FIG. 10 is a GPC chart of an epoxy resin (A-6) obtained in Comparative synthesis example 2.

A flask equipped with a thermometer, a dropping funnel, a condenser, a fractional distillation column, and a stirrer was charged with 216 parts of β-naphthol (1.50 mol), 54 parts of α-naphthol (0.37 mol), 130 parts of isopropyl alcohol, 122 parts of 37% formalin aqueous solution (1.50 mol), and 5 parts of 49% sodium hydroxide (0.06 mol). This mixture was heated from room temperature to 75° C. under stirring and stirred at 75° C. for two hours. This mixture was subsequently treated as in Example 1 to provide 200 parts by mass of a target epoxy resin (A-6). The obtained epoxy resin (A-6) had an epoxy equivalent weight of 238 g/eq. The GPC chart is shown in FIG. 10. From the GPC chart, the trimer (x1) had a content of 30.5%, the dimer (x2) had a content of 35.8%, and the calixarene compound (x3) had a content of 0.0%.

Examples 5 to 8 and Comparative Examples 1 and 2

Evaluation of Solvent Solubility

In a sample vial, each of the epoxy resins (10 parts by mass) obtained in the Examples and Comparative synthesis examples was dissolved in 4.3 parts by mass of methyl ethyl ketone in a sealed state at 60° C. This solution was then cooled to 25° C. and evaluated as to whether crystals precipitated. The case in which no crystal precipitated was evaluated as Good. The case in which crystals precipitated was evaluated as Poor. The results are described in Table 1.

TABLE 1

|  | Example 5 | Example 6 | Example 7 | Example 8 | Comparative example 1 | Comparative example 2 |
| --- | --- | --- | --- | --- | --- | --- |
| Epoxy resin | A-1 | A-2 | A-3 | A-4 | A-5 | A-6 |
| Solvent solubility | Good | Good | Good | Good | Good | Poor |

Examples 9 to 12 and Comparative Examples 3 and 4

In accordance with the formulations described in Table 2 below, the following were mixed: a phenol-novolac resin ("TD-2090" manufactured by DIC Corporation, hydroxyl equivalent weight: 105 g/eq) serving as a curing agent, (A-1) to (A-6) serving as epoxy resins, and 2-ethyl-4-methylimidazole (2E4MZ) serving as a curing accelerator. Adjustment was performed by addition of methyl ethyl ketone such that the non-volatile content (N.V.) of each composition was finally 58% by mass.

Subsequently, each composition was cured under the following conditions to experimentally produce a multilayer plate. The multilayer plate was evaluated in terms of thermal expansion coefficient and change in heat resistance due to thermal history in the following manner. The results are described in Table 2.

<Multilayer Plate Production Conditions>

Base: glass cloth "#2116" manufactured by Nitto Boseki Co., Ltd. (210×280 mm)

Number of plies: 6 Prepreg-forming condition: 160° C.

Curing conditions: 200° C., 40 kg/cm², 1.5 hours; Thickness of formed plate: 0.8 mm <Change in Heat Resistance Due to Thermal History (Change Amount in Heat Resistance: ΔTg): DMA (Tg Difference Between the First Measurement and the Second Measurement)>

A temperature (Tg) at which the change in elastic modulus is maximized (tan δ change rate is maximum) was measured twice under the following temperature conditions with a viscoelastometer (DMA: solid viscoelastometer "RSAII" manufactured by Rheometric Scientific, Inc., rectangular tension method; frequency: 1 Hz; temperature increase rate: 3° C./min).

Temperature Conditions

First measurement: temperature increase from 35° C. to 275° C. at 3° C./min

Second measurement: temperature increase from 35° C. to 330° C. at 3° C./min

The temperature difference obtained was evaluated as ΔTg.

<Thermal Expansion Coefficient>

The multilayer plate was cut in a size of 5 mm×5 mm×0.8 mm and this test piece was subjected to thermomechanical analysis in the compression mode with a thermomechanical analyzer (TMA: SS-6100, manufactured by Seiko Instruments Inc.).

Measurement Conditions

Measurement load: 88.8 mN

Temperature increase rate: 10° C./min, twice

Measurement temperature range: −50° C. to 300° C.

The same sample was measured twice under the above-described conditions. In the second measurement, the average linear expansion coefficient in the temperature range of 40° C. to 60° C. was evaluated as the thermal expansion coefficient.

TABLE 2

|  |  | Example 9 | Example 10 | Example 11 | Example 12 | Comparative example 3 | Comparative example 4 |
|---|---|---|---|---|---|---|---|
| Epoxy resin | A-1 | 69.0 |  |  |  |  |  |
|  | A-2 |  | 69.7 |  |  |  |  |
|  | A-3 |  |  | 68.7 |  |  |  |
|  | A-4 |  |  |  | 68.5 |  |  |
|  | A-5 |  |  |  |  | 69.3 |  |
|  | A-6 |  |  |  |  |  | 69.4 |
| Curing agent | TD-2090 | 31.0 | 30.3 | 31.3 | 31.5 | 30.7 | 30.6 |
|  | 2E4MZ | 0.05 | 0.05 | 0.05 | 0.05 | 0.05 | 0.05 |
| ΔTg (° C.) |  | 8 | 9 | 8 | 5 | 15 | 14 |
| Thermal expansion coefficient (ppm) |  | 50 | 41 | 43 | 48 | 60 | 59 |

Abbreviations in Table 2 are as follows.
TD-2090: phenol-novolac phenolic resin ("TD-2090", manufactured by DIC Corporation, hydroxyl equivalent weight: 105 g/eq)
2E4MZ: curing accelerator (2-ethyl-4-methylimidazole)

The invention claimed is:

1. An epoxy resin that is a polyglycidyl ether of a polycondensate of an α-naphthol compound, a β-naphthol compound, and formaldehyde, the epoxy resin comprising:

a trimer (x1) represented by a structural formula (1) below

[Chem. 1]

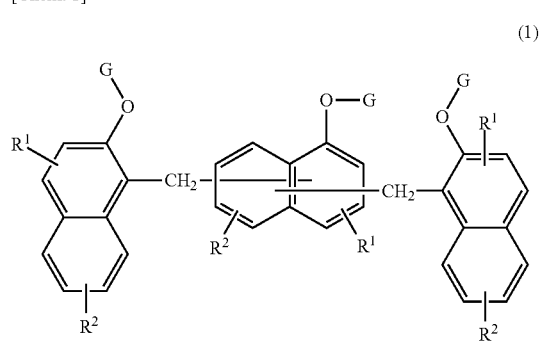

(1)

in the formula, $R^1$ and $R^2$ each independently represent a hydrogen atom, an alkyl group having 1 to 4 carbon atoms, or an alkoxy group having 1 to 4 carbon atoms; and G represents a glycidyl group; and a dimer (x2) represented by a structural formula (2) below

[Chem. 2]

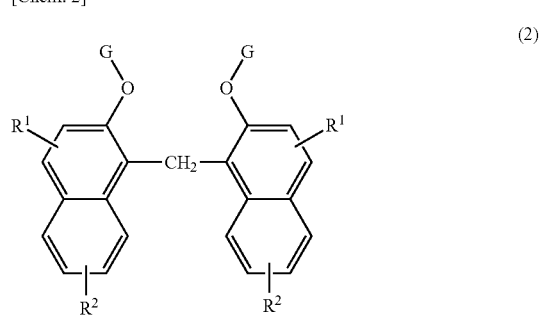

(2)

in the formula, $R^1$ and $R^2$ each independently represent a hydrogen atom, an alkyl group having 1 to 4 carbon atoms, or an alkoxy group having 1 to 4 carbon atoms; and G represents a glycidyl group, wherein a content of the trimer (x1) is 15% to 35% in terms of area percentage in GPC measurement, and a content of the dimer (x2) is 1% to 25% in terms of area percentage in GPC measurement, further comprising a calixarene compound (x3) represented by a structural formula (3) below

[Chem. 3]

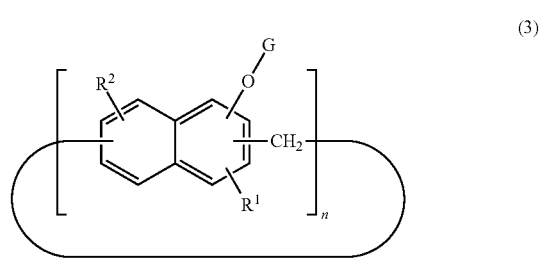

(3)

in the formula, $R^1$ and $R^2$ each independently represent a hydrogen atom, an alkyl group having 1 to 4 carbon atoms, or an alkoxy group having 1 to 4 carbon atoms; G represents a glycidyl group; and n represents a number of the repeating unit and an integer of 2 to 10, wherein a content of the calixarene compound (x3) in the epoxy resin is 1% to 40% in terms of area percentage in GPC measurement.

2. The epoxy resin according to claim 1, having an epoxy equivalent weight in a range of 210 to 300 g/eq.

3. The epoxy resin according to claim 2, having a softening point in a range of 95° C. to 140° C.

4. A curable resin composition comprising the epoxy resin according to claim 3 and a curing agent.

5. A cured product produced by curing the curable resin composition according to claim 4.

6. A printed wiring board produced by mixing the curable resin composition according to claim 4 with an organic solvent to prepare a resin composition varnish, impregnating the resin composition varnish into a reinforcing base, and subjecting a laminate of the reinforcing base and a copper foil to thermocompression bonding.

7. A curable resin composition comprising the epoxy resin according to claim 2 and a curing agent.

8. A cured product produced by curing the curable resin composition according to claim 7.

9. A printed wiring board produced by mixing the curable resin composition according to claim 7 with an organic solvent to prepare a resin composition varnish, impregnating the resin composition varnish into a reinforcing base, and subjecting a laminate of the reinforcing base and a copper foil to thermocompression bonding.

10. The epoxy resin according to claim 1, having a softening point in a range of 95° C. to 140° C.

11. A curable resin composition comprising the epoxy resin according to claim 10 and a curing agent.

12. A cured product produced by curing the curable resin composition according claim 11.

13. A printed wiring board produced by mixing the curable resin composition according to claim 11 with an organic solvent to prepare a resin composition varnish, impregnating the resin composition varnish into a reinforcing base, and subjecting a laminate of the reinforcing base and a copper foil to thermocompression bonding.

14. A curable resin composition comprising the epoxy resin according to claim 1 and a curing agent.

15. A cured product produced by curing the curable resin composition according to claim 14.

16. A printed wiring board produced by mixing the curable resin composition according to claim 14 with an organic solvent to prepare a resin composition varnish, impregnating the resin composition varnish into a reinforcing base, and subjecting a laminate of the reinforcing base and a copper foil to thermocompression bonding.

* * * * *